United States Patent [19]

Pass

[11] Patent Number: 5,046,972
[45] Date of Patent: Sep. 10, 1991

[54] LOW INSERTION FORCE CONNECTOR AND CONTACT

[75] Inventor: Raymond V. Pass, Camp Hill, Pa.

[73] Assignee: AMP Incorporated, Harrisburg, Pa.

[21] Appl. No.: 551,115

[22] Filed: Jul. 11, 1990

[51] Int. Cl.⁵ .......................................... H01R 13/42
[52] U.S. Cl. .................................... 439/751; 439/856; 439/249
[58] Field of Search ............................ 439/246–249, 439/251, 252, 851–857, 741, 751, 78, 82, 83

[56] References Cited

U.S. PATENT DOCUMENTS

| | | | |
|---|---|---|---|
| 2,468,368 | 4/1949 | Jackson | 439/857 |
| 2,658,183 | 11/1953 | Klostermann et al. | 439/249 |
| 3,915,537 | 10/1975 | Harris et al. | 439/249 |
| 4,359,258 | 11/1982 | Palecek et al. | 439/851 |
| 4,408,824 | 10/1983 | Weidler | 439/398 |
| 4,717,354 | 1/1988 | McCleerey | 439/751 |
| 4,907,990 | 3/1990 | Bertho et al. | 439/856 |
| 4,966,557 | 10/1990 | Barkus et al. | 439/751 |

*Primary Examiner*—David L. Pirlot
*Attorney, Agent, or Firm*—Allen B. Osborne

[57] ABSTRACT

A multi-pin grid array socket connector (20) features a contact (40) including spring arms (58) which flex to reduce binding caused by out of place pins (16) of a pin grid array (12) inserted and withdrawn therefrom facilitating high pin count arrays to be mated with low overall mating forces.

1 Claim, 4 Drawing Sheets

LOW INSERTION FORCE CONNECTOR AND CONTACT

The present invention relates to a multi-pin grid array socket connector having contacts which include spring arms which flex to reduce binding caused by out of place pins of a pin grid array plugged into such connector.

This application is a continuation-in-part of U.S. Pat. Application No. 132,307, the disclosure therein being incorporated by reference herein.

Increasing complexity of electronic circuits including specifically integrated circuits has led to packaging wherein circuit interconnections to a given package are quite large in number. Pin grid arrays are now utilized which have more than a hundred pins and in some instances hundreds of pins projecting therefrom with each pin needing to be terminated to a socket and thereby to a printed circuit board or equivalent functional circuit. A variety of connectors have been developed to accommodate high pin count packages, including the so-called zero entry socket concepts which are activated mechanically to effect an interconnection with the pins of packages. The difficulty in maintaining tolerances to accommodate hundreds of pins simultaneously in the interconnection is met with complex and expensive assemblies. Low insertion force connectors are less costly but risk package integrity due to the overall forces required for multi-pin insertion. One of the main reasons for high forces results from the pins of a given package being misaligned, either due to manufacture originally or to being displaced accidentally in handling and inventory. Misaligned pins cause not only high insertion force by binding in the respective sockets into which they are plugged but also can damage such contacts by inelastically deforming them during forced insertion. The aforementioned patent application offers a solution to such problem in the form of a socket design for connectors to receive pin grid arrays incorporating a circular connector contact which has a seam and is carried on a flexible arm to allow float or flex of the contact while making a relatively constant force engagement with a mated pin.

The present invention has as an object the provision of a multi-pin grid array socket connector of improved flexibility and reduced complexity. It is a further object to provide a socket connector formed of relatively straightforward flex sections adapted to maintain a constant engaging force with respect to a mating pin over a range of center spacings of such pin in mating engagement. It is a particular object of the invention to provide a socket contact for a connector for high pin count pin grid arrays having low overall insertion forces with respect to package insertion.

SUMMARY OF THE INVENTION

The present invention features a multi-pin grid array socket connector which has a contact having a base or mounting portion fixing such contact within the cavity of a plastic connector block. The contact includes a post projecting from the block adapted to be interconnected to a printed circuit board and further includes oppositely oriented and aligned with an aperture in the upper surface of the block, a pair of opposed spring contact arms spaced apart to engage the pin of a pin grid array package inserted therebetween. The spring arms are flexible to be deformed by the insertion of the pin to result in a transverse or normal force of contact engagement between such contacts and the pin to maintain a stable, low resistance interface and circuit connection therewith. The contact spring arms are each formed of extensions of further spring portions oriented vertically within the block cavity and allowing the spring arms to move transversely responsive to offset or misaligned pins inserted therewithin. Each of the arms is connected by an integral strap holding the arms relatively together in a fixed spacing notwithstanding the overall displacement of the arms by offset pins. The flexing thus allowed accommodates pin misalignment in one direction with respect to the block. The contact arms, which are formed of flat stock plated at the contact points, form in essence lines of contact accommodating displacement in an opposite or transverse sense with respect to pins plugged into said contact arms. Each contact includes features allowing the contact to be fixed within the cavity of a block and further includes a flange and apertured portion. The contacts of the present invention are formed of relatively straightforward flat and rectangular sections of conductive spring grade material to be readily stamped and formed and adapted to be fitted within rectangular cross-sectioned cavities in housing block.

IN THE DRAWINGS

DETAILED DESCRIPTION OF THE INVENTION

Figure 1:
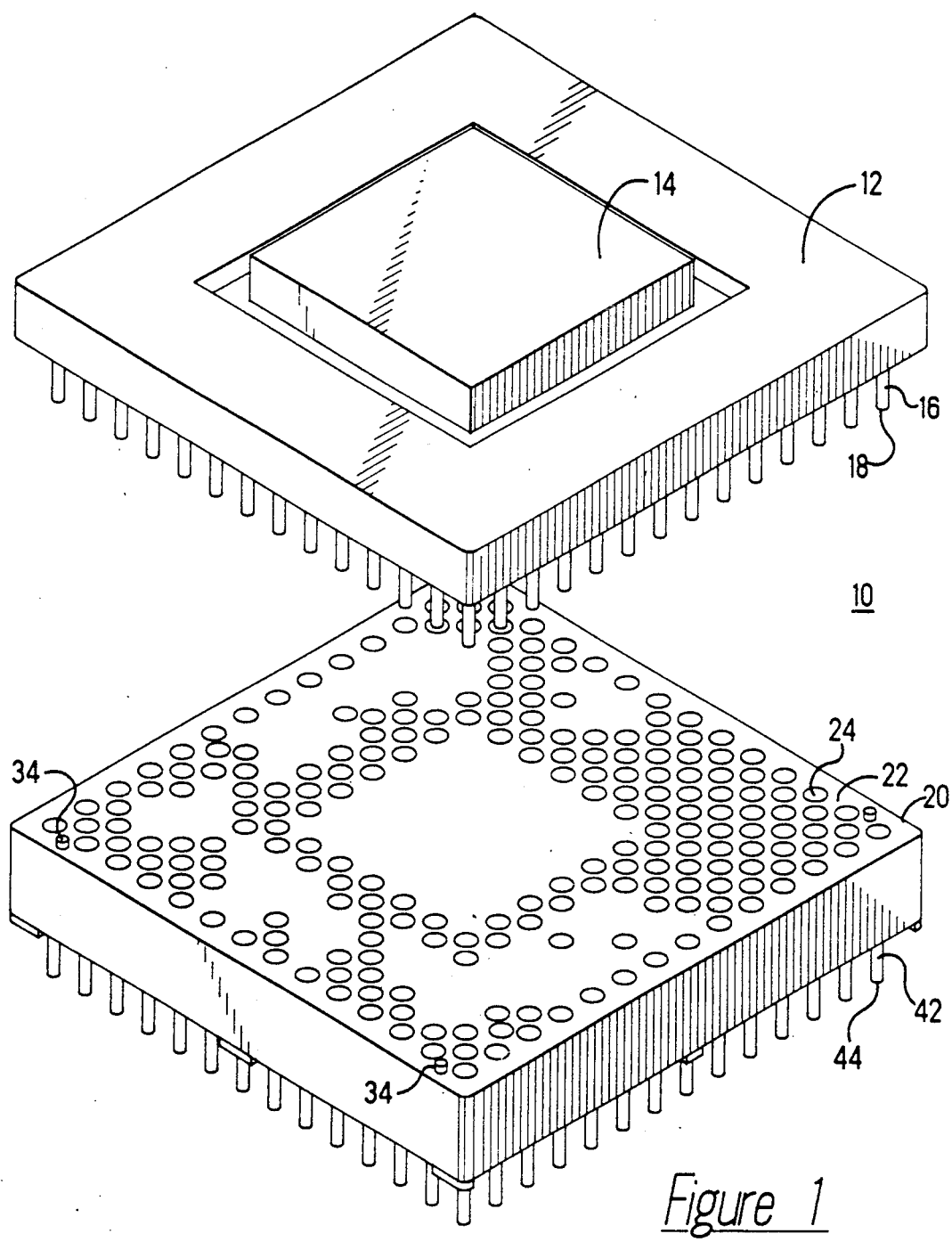
FIG. 1 is a perspective, much enlarged from actual size, of an assembly including a pin grid array and a socket preparatory to mating.

Referring now to FIG. 1, an assembly 10 is shown to include an electronic package in the form of a pin grid array 12 containing an integrated circuit 14 and array of projecting pins 16 with each pin radiused as at 18 to facilitate insertion in a mating contact. While not shown, the individual circuit paths of the integrated circuit 14 are connected to the pins 16 by traces internal to package 12. To facilitate the functioning of the package 12, each of the circuits therein and the components internally thereof must be connected as by the pins 16 into further circuits contained in a printed circuit board not shown. This interconnection of the various pins 16 is accomplished through a connector 20 comprised of a plastic and dielectric block 22 containing a grid of apertures 24 in a grid array matching the array of pins 16 in package 12. Each of the apertures 24 is made to contain a socket contact 40 of a configuration shown in FIG. 3 which includes a projecting pin portion 42 beveled for ease of insertion as at 44 with respect to insertion in apertures in a printed circuit board. The various pin portions 42 are interconnected to the circuits in the printed circuit board as by soldering with the printed circuit board containing circuit traces and additional components to form a functioning device. The connector 20 thus facilitates an interconnection with package 12 and, if required, a separation and withdrawal of package 12 and replacement thereof with an alternative integrated circuit.

Figure 2:
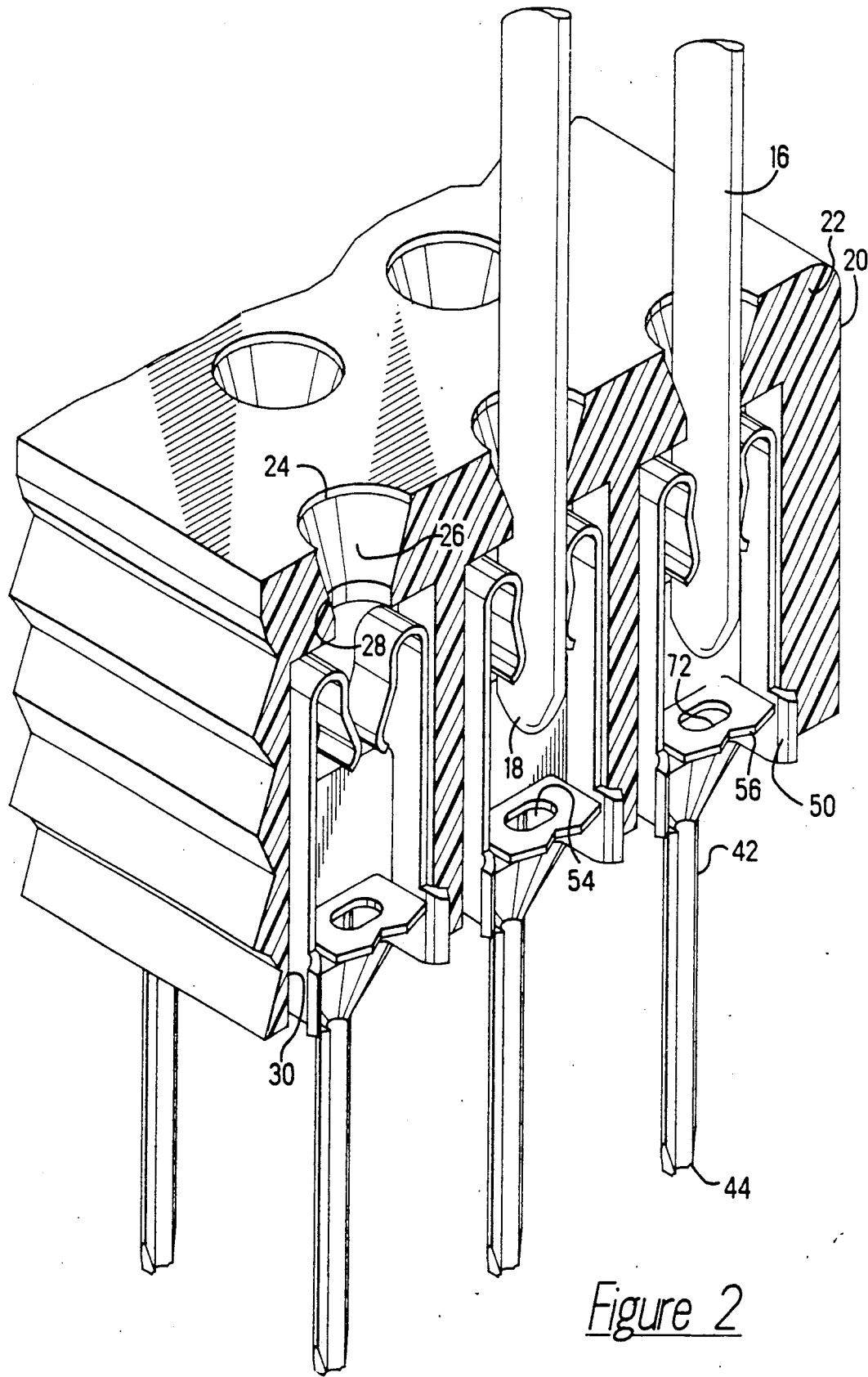
FIG. 2 is a view of a portion of the connector socket shown in FIG. 1, partially sectioned, including pin and contact details.

FIG. 2 shows the pins 6 plugged into the sockets of connector 20. The upper ends of pin 16 are metallurgically bonded to the substrate of 12 and it is to be understood that such pins would be joined to the individual circuit traces of package 12.

Figure 4:
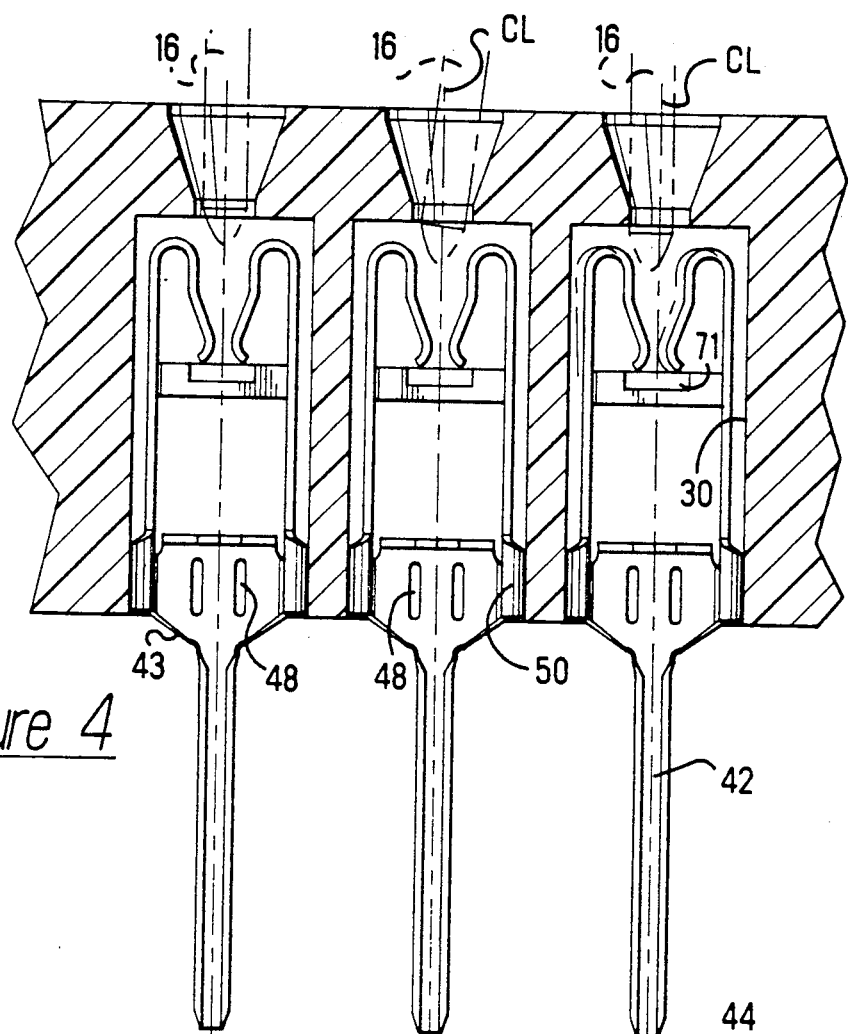
FIG. 4 is an elevational and sectioned view of the socket connector showing contacts from the side thereof.
Figure 5:
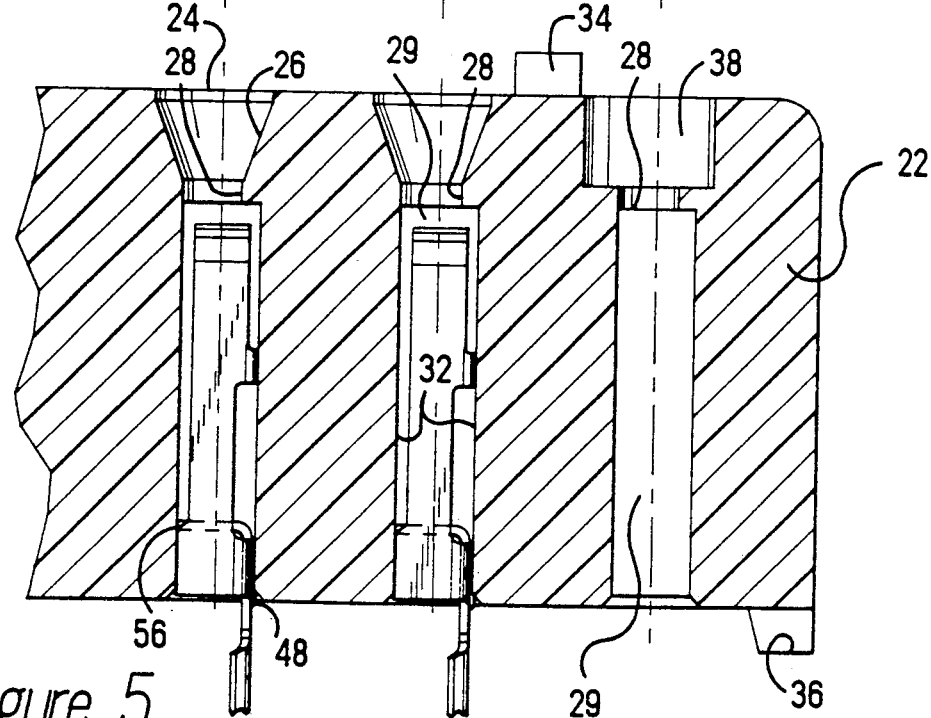
FIG. 5 is a sectional view of the block of the invention containing contacts in an elevational view rotated 90 degrees from that shown in FIG. 4.

As can be discerned from FIGS. 2, 4, and 5, the block 20 which is formed of plastic material having suitable dielectric qualities includes in the upper surface the apertures 24 which as can be seen in these figures open from a relatively large diameter into a tapering funnel-shaped surface 26 and a further aperture 28. The funnel-shaped surface 26 operates to guide the ends of pins 16 which are radiused as at 18 as mentioned onto center lines compatible with the arrangement of sockets within 20. The apertures 28 are larger in cross-section than the pins 16 to ease insertion of the pins within housing 20. With respect to pins 16 and referring to FIGS. 4 and 5, the apertures and surfaces related to 24, 26, and 28 are placed on nominal center lines C/L which are nominally on the same center lines as pins 16 of package 12. Shown in phantom in FIG. 4 are two examples of displacement of pins 16. In the right-hand cavity a pin 16 is shown to be aligned parallel to the center line but offset therefrom. In the second, or middle, cavity the pin is shown, exaggerated, cocked or slanted relative to such center line. With respect to the left-hand cavity, the pin 16 is shown aligned with the center line. A number of problems are caused by these various alignments. The first problem is that the pins 16 are relatively fixed together by the package 12 and a dimensional variation between the left-hand and right-hand pins 16 creates a binding of the pins with respect to not only the housing of block 20, but with respect to the sockets contained therein. This binding can result in the deformation inelastically of the contacts and damages thereto and also could result in only one part of the contact arm engaging the pin. The same is true with respect to the cocked center pin 16. It is these problems that the present invention addresses.

Referring now to FIGS. 4 and 5, the block 20 including the housing 22, includes a series of cavities 29 which open at the upper surface into the apertures 24. The cavities 29 are rectangular in cross-section and are defined by vertical wall surfaces 30 and 32. Also to be discerned from FIGS. 1 and 5, the block housing 22 includes a series of small projections 34 on the upper surface thereof and 36 on the lower surface thereof which serve as standoffs. The projections 36 hold the block housing 22 off the printed circuit board (not shown) to allow cleaning of fluxes and other materials therebetween following soldering operations. The projections 34 limit the engagement of the lower surface of package 12 with the upper surface of housing 22. Also shown in FIG. 5 with respect to the righthand cavity is a relief 38 which may be utilized to receive projecting pin portions (not shown) from the lower face of package 12.

Figure 3:
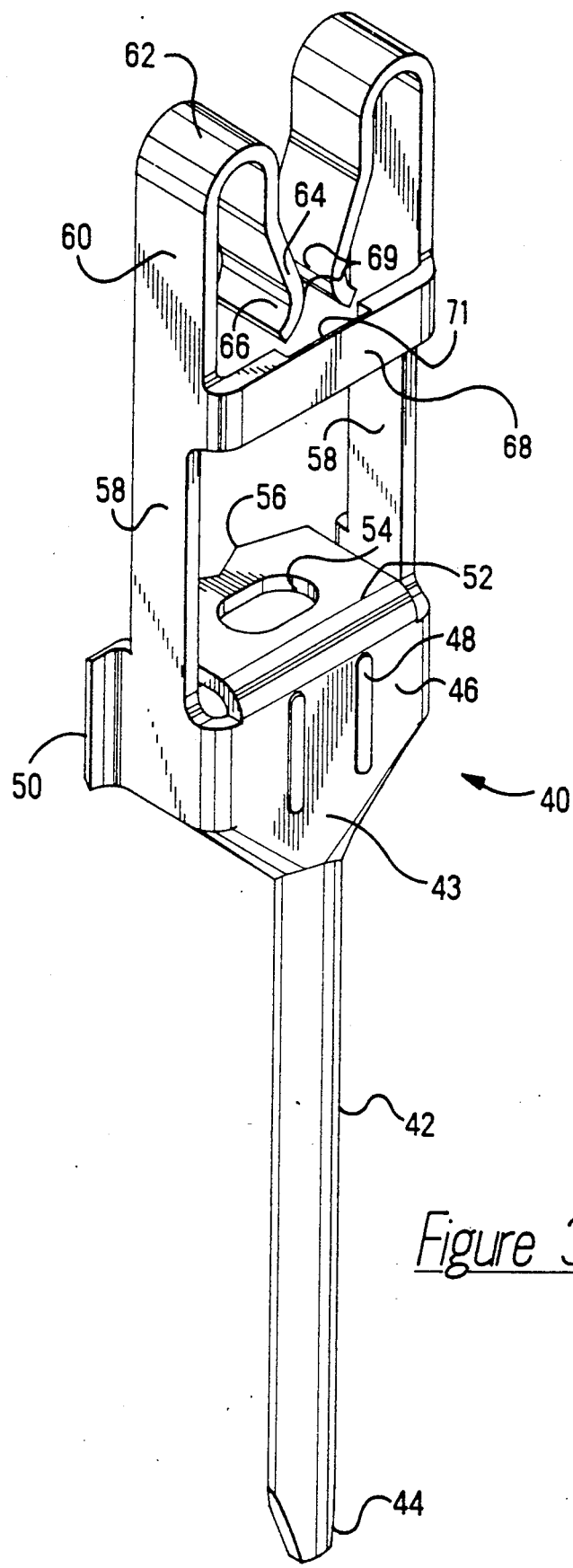
FIG. 3 is a perspective of the contact of the invention.

Within each cavity of housing 20 is fitted a socket contact 40 as shown in FIG. 3. As can be seen, each socket contact 40 includes the aforementioned lower post portion 42 beveled as at 44 for ease of insertion in printed circuit board and adapted to be soldered to such board to terminate the socket thereto. A portion 43 tapers to provide a transition between the post 42 and the upper portions of the socket. These upper portions include a base or mounting structure comprised of the portion 46 embossed as at 48 and including projections 50 and a flange portion 52 apertured as at 54 and included serrated edges 56. FIG. 5 shows the embossments 48 bearing against the interior wall surface 32 of the cavities of the block on one side thereof with the serrated edges 56 bearing against the opposite wall surface 32. In practice, the dimensions of these features are such as to cause the edges 56 to bite into the plastic of the block and tend to center and lock the sockets therewithin. As shown in FIG. 4, the edges 50 bite into the opposing surfaces 30 of each cavity to also center and fix the sockets within the cavities.

Projecting upwardly from the base portion of the socket are a pair of spring arms 58 which join integrally therewith further arm portions 60 joining end portions 62 which carry arms extending downwardly shown as 64 which end as at 66 in a rounded portion. These arms define contact surfaces 69 which define line contacts extending the widths of such arms. The contact arms, including the portions 58 and 60, are held relatively fixed by a strap 68 integrally formed therewith. As shown in FIGS. 3 and 4 toward the center of the strap 68 is a relief 71 which reduces the thickness of the strap thereof and provides a surface, preferably beveled, adapted to cooperate with the radius 18 of pin 16 and preclude stubbing of the pin on strap 68.

As can be discerned from FIGS. 4 and 5, the exterior dimensions of the socket, including specifically the spring portions 58 and 60, are substantially less than the cross-sectional area provided by surfaces 30 and 32 of the cavities of the housing 22. This leaves the socket structure free for movement within said cavities, particularly with respect to transverse movement relative to the center lines as shown in FIG. 4. The spring portions 58 are particularly designed in terms of geometry and length to facilitate a movement of the spring arms 64 in such transverse relationship, provide a flexibility and float of the sockets side to side to accommodate to the misplacement or misalignment of posts 16 as shown in FIG. 4. The line contact 69 of the contact arms 64 facilitates misalignment in a sense transverse to the displacement of spring arms 58. Because of the spring action and the line contact, binding of contact pins with respect to sockets is reduced and insertion forces are minimized. Additionally, damage to the contact arms through inelastic deformation is minimized, the Whole socket structure shifting or the particular contact point with respect to 69 varying to accommodate misplaced pins. Moreover, since the contact arms 64 move together due to the action of the strap 68, the normal or transverse forces defining a low resistance interface between pin and socket are maintained relatively constant.

With respect to the invention, the housing block 20, including the housing 22, was molded of an engineering plastic having appropriate desirable dielectric qualities and molding repeatability. The sockets were formed of a copper alloy such as phosphor bronze or beryllium copper having a hardness on the order of number 4 or number 6, suitably stamped and formed and plated to assure a stable low-resistance contact between pins and sockets and to facilitate soldering of the pin portions 42 to printed circuit boards.

Having now disclosed the invention in terms intended to enable a preferred practice thereof, the appended claims define what is asserted as inventive.

I claim:

1. An electrical socket connector for interconnecting an electronic package to a circuit board, comprising:
a housing having cavities therein which communicate with apertures opening on one surface and further which open on an opposite surface; and
conductive terminals positioned in respective said cavities and having a post portion extending outwardly through said opening on said opposite surface for insertion into a circuit board and further having a base portion at an upper end of said post portion, said base portion defined by a wall having parallel arms extending laterally from each side and a flange extending lateral from a third side, said parallel arms being provided with cavity wall engaging projections projecting outwardly from and normally to free ends thereof, said flange having a serrated free edge for biting into another cavity wall, said terminals further having parallel spring arms attached to and extending outwardly from an edge of respective said parallel arm, said spring arms having free ends bent back in to face said flange and to cooperatively form a socket for receiving a pin on an electronic package.

* * * * *